(12) United States Patent
Boucher et al.

(10) Patent No.: US 6,641,254 B1
(45) Date of Patent: Nov. 4, 2003

(54) ELECTRONIC DEVICES HAVING AN INORGANIC FILM

(75) Inventors: William R Boucher, Corvallis, OR (US); Michael G Groh, Albany, OR (US); Todd A. Berdahl, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 5 days.

(21) Appl. No.: 10/121,394

(22) Filed: Apr. 12, 2002

(51) Int. Cl.$^7$ .................................. B41J 2/16
(52) U.S. Cl. ........................................ 347/50
(58) Field of Search ................. 347/50, 20, 5, 347/9, 12, 13, 14, 144, 143, 142, 141, 112, 111, 54, 56, 63, 65; 439/65, 69, 68, 74, 85

(56) References Cited

U.S. PATENT DOCUMENTS

| | | |
|---|---|---|
| 5,336,928 A | 8/1994 | Neugebauer et al. |
| 5,538,586 A | 7/1996 | Swanson et al. |
| 5,638,101 A | 6/1997 | Keefe et al. |
| 5,682,065 A | 10/1997 | Farnworth et al. |
| 5,953,032 A | 9/1999 | Haarz et al. |
| 6,170,931 B1 | 1/2001 | Anderson et al. |
| 6,227,651 B1 | 5/2001 | Watts et al. |
| 6,267,472 B1 | 7/2001 | Maher et al. |
| 6,322,200 B1 | 11/2001 | Feinn et al. |
| 6,326,235 B1 | 12/2001 | Glenn |
| 6,326,697 B1 | 12/2001 | Farnworth |
| 6,326,700 B1 | 12/2001 | Bai et al. |
| 6,329,222 B1 | 12/2001 | Corisis et al. |
| 6,329,709 B1 | 12/2001 | Moden et al. |
| 6,331,737 B1 | 12/2001 | Lim et al. |
| 6,341,845 B1 | 1/2002 | Scheffelin et al. |

*Primary Examiner*—Raquel Yvette Gordon
(74) *Attorney, Agent, or Firm*—Donald J. Coulman

(57) ABSTRACT

An electronic device includes a substrate, a substrate electrical connector disposed on the substrate, and a carrier lead electrically coupled to the substrate electrical connector. In addition, the electronic device further includes a polymer enclosing the substrate electrical connector, and an inorganic film disposed over the substrate electrical connector in contact with the polymer.

47 Claims, 8 Drawing Sheets

ELECTRONIC DEVICES HAVING AN INORGANIC FILM

BACKGROUND

Description of the Art

The increased utilization of electronic devices, in an ever widening array of diverse technologies, such as computers, automotive, medical, and household appliances has led to the operation of many of these electronic devices in harsh environments such as high humidity, high temperatures, or combinations thereof. In addition, there is also an increased demand for reliability. The continued improvement in performance and component density, of semiconductor devices, has led to a rapidly growing demand for packaging technologies to yield packaged devices having reduced cost, improved reliability and performance, increased interconnect density, and small package size.

Typically, a semiconductor device includes a semiconductor die with bond pads formed on its surface, and bond wires that electrically couple the bond pads with lead fingers on a lead frame. The semiconductor die is attached to the lead frame before bonding, and typically a polymer is dispensed or molded around the die, the bond wires, and the majority of the lead frame to encapsulate the device. The device is often electrically coupled with a printed circuit board (PCB) by soldering leads of the lead frame to pads on the PCB. The utilization of some encapsulating polymers can lead to performance degradation and damage from electrical shorting, corrosion, or cracking due to moisture. This tends to be an even greater problem when the electronic device must operate in a harsh environment.

Hermetic sealing using a metal or ceramic package provides an increased level of protection, however, the manufacturing process is complex and results in a more expensive package of increased size. Another method that can be utilized is sealing a semiconductor chip's active circuitry at the wafer stage, by applying a passivation coating over the active circuitry on the wafer. However, this process may still lead to a non-hermetically sealed device, by causing damage to the ceramic like coating in the vicinity of the bond pads in subsequent processing, thereby permitting corrosion to deleteriously affect chip reliability and life. Further, this process does not provide protection to the bond pads and electrical interconnections. In addition, these technologies do not lend themselves to all applications. For instance, over the past decade, substantial developments have been made in the micromanipulation of fluids, in fields such as electronic printing technology using inkjet printers. The ability to maintain reliable electrical interconnections in such products has become more difficult as the corrosive nature of the fluids increases.

An inkjet print cartridge provides a good example of the problems facing the practitioner in providing robust electrical interconnections to a semiconductor chip operating in a harsh environment. There are a wide variety of highly-efficient inkjet printing systems, currently in use, which are capable of dispensing ink in a rapid and accurate manner. Conventionally, electrical interconnections are made using a flexible circuit that has metal beams that extend out from the flexible substrate and are coupled to bond pads located on the inkjet chip. A polymer encapsulant is dispensed onto the coupled bond pads and beams and is then cured.

Ink jet cartridges typically include a fluid reservoir that is fluidically coupled to a substrate that is attached to the back of a nozzle layer containing one or more nozzles through which fluid is ejected. The substrate normally contains an energy-generating element that generates the force necessary for ejecting the fluid held in the reservoir. Two widely used energy generating elements are thermal resistors and piezoelectric elements. The former rapidly heats a component in the fluid above its boiling point causing ejection of a drop of the fluid. The latter utilizes a voltage pulse to generate a compressive force on the fluid resulting in ejection of a drop of the fluid.

In particular, improvements in image quality have led to the use of more complex ink formulations that generally increases the organic content of inkjet inks. The use of such inks, results in a more corrosive environment experienced by the materials coming in contact with these inks. Thus, degradation of the electrical interconnections by these more corrosive inks raises material compatibility issues as well as design issues in order to maintain reliable printheads. In addition, improvement in print speed has typically been gained by utilizing a larger printhead resulting in an increased print swath. The larger printhead typically results in a larger number energy generating elements, which can result in an increase number of electrical interconnections thereby exacerbating the problem. In addition, higher resolution may result in a larger number interconnects, closer spaced, with thinner organic passivation further contributing to reliability issues. Further, in an effort to reduce the cost and size of ink jet printers and to reduce the cost per printed page, printers have been developed having small, moving printheads that are connected to large stationary ink supplies. This development is called "off-axis" printing and has allowed the large ink supplies to be replaced as it is consumed without requiring the frequent replacement of the costly printhead containing the fluid ejectors and nozzle system. Thus, the typical "off-axis" system often utilizes a semi-permanent or permanent printhead that requires increased reliability and robustness of the electrical interconnections to maintain its optimal performance.

SUMMARY OF THE INVENTION

An electronic device includes a substrate, a substrate electrical connector disposed on the substrate, and a carrier lead electrically coupled to the substrate electrical connector. In addition, the electronic device further includes a polymer enclosing the substrate electrical connector, and an inorganic film disposed over the substrate electrical connector in contact with the polymer.

DETAILED DESCRIPTION OF THE INVENTION

Figure 1:
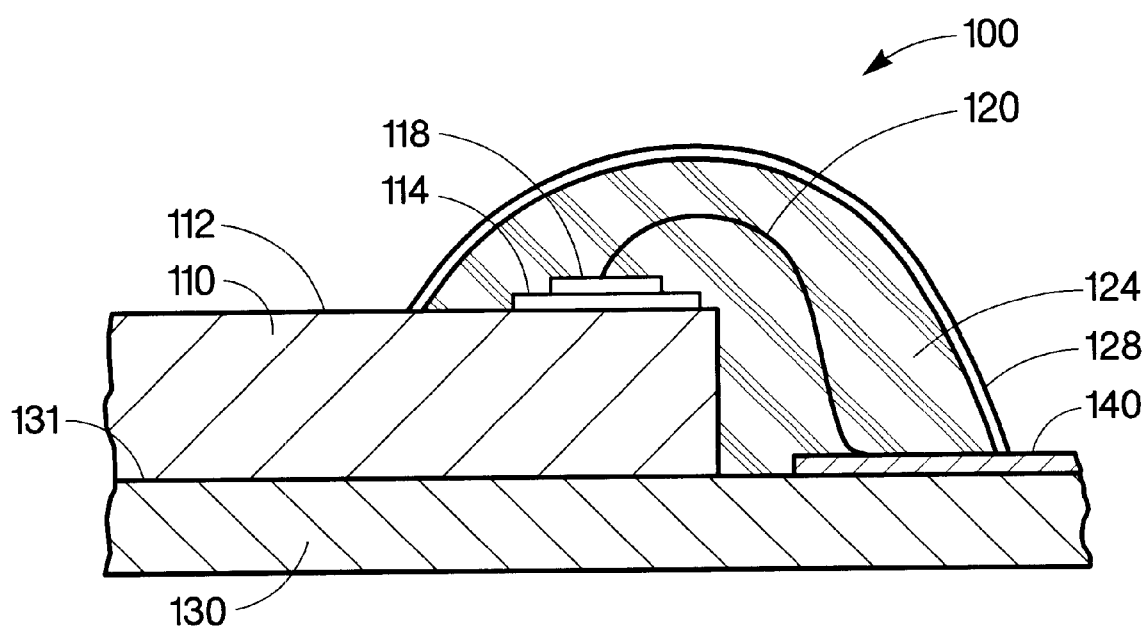
FIG. 1 is a cross-sectional view of an electronic device according to an embodiment of the present invention.

Referring to FIG. 1, an embodiment of the present invention is shown in a simplified cross-sectional view. In this embodiment, electronic device 100 includes inorganic layer 128 providing moisture and corrosion protection to electrical interconnection 120 and electrical connector 118. Substrate 110 is disposed over base 130, and includes dielectric layer 114 that is formed over at least a portion of substrate 110, providing electrical isolation for one or more electrical connectors 118. Preferably substrate 110 also includes one or more transistors or other logic devices (not shown) formed on substrate 110. Electrical interconnection 120 electrically couples electrical connector 118 to carrier lead 140 providing signal as well as power connections to electronic device 100. Inorganic film 128 is formed over polymer 124 that encloses electrical interconnection 120 and electrical connector 118. The combination of inorganic film 128 and polymer 124 provides protection against environmental degradation as well as mechanical support to reduce damage of electrical interconnection 120 and electrical connector 118.

Preferably, substrate 110 is a silicon integrated circuit, however, materials such as germanium, gallium arsenide, amorphous silicon, aluminum oxide, polysilicon, and other substrates that support active and passive devices can also be utilized. With reference to FIG. 1 substrate 110 is preferably manufactured using a silicon wafer. Using conventional semiconductor processing equipment, transistors as well as other logic devices required for electronic device 100 are formed in substrate 110. The particular structure of the transistors is not relevant to the present invention, however some type of solid state electronic device is preferably present, such as, metal oxide field effect transistors (MOSFET), bipolar junction transistors (BJT). Although FIG. 1 shows only one electrical connector 118, typically there are a plurality of electrical connectors positioned near opposed edges of substrate 110 that are connected to the transistors or other logic devices. The present invention as described herein is applicable irrespective of the electrical connector position on the substrate.

In this embodiment base 130 may be formed from metal, ceramic, or plastic materials or some combinations thereof. Materials suitable for base 130 include, metals, metal alloys, liquid crystal polymers, polyphenylene oxide, epoxy resins, polyimide resins, FR4 resins, aluminum oxide, and glass to name a few. For example, base 130 may be a metal lead frame, a ceramic die carrier, or a flexible circuit. In one embodiment, base 130 is a metal lead frame. Substrate 110 has an active surface 112 on which electronic components and electrical circuits are formed and an opposing surface 131. Although FIG. 1 shows substrate 110 coupled directly to base 130 a spacer layer (not shown) may also be utilized, depending on the particular application of electronic device 100. The spacer or compliant layer provides stress relaxation related to the difference in the thermal expansion of the substrate and substrate carrier materials, thereby providing a wider choice of materials.

Dielectric layer 114 is formed over at least a portion of substrate 110 utilizing conventional semiconductor processing equipment. Preferably, dielectric layer 114 is silicon dioxide, however, other dielectric layers such as silicon nitride, silicon carbide, aluminum oxide, polyimides and other dielectric materials found in electronic devices can also be used. Electrical connector 118 is typically formed from a metal or metal alloy, such as aluminum or an aluminum alloy. In addition, some devices use pads or bumps formed from other metals and metal alloys such as copper, gold, silver, palladium and alloys of such metals. Preferably, electrical connector 118 is aluminum formed using conventional semiconductor deposition equipment; however, other techniques such as screen-printing or electroplating can also be utilized. Electrical interconnection 120 preferably is formed via wire bonding using lead wires formed from gold aluminum or alloys thereof. However, depending on the particular application of electronic device 100, other interconnection schemes can also be utilized. For example, electrical interconnection 120 may be a solder bump for use in a ball grid array package. Another example is the use of a flexible substrate utilizing tape automated bonding (TAB) for electrical interconnection 120. A further example is the use of a conductive adhesive or anisotropic conductive adhesive forming electrical interconnection 120.

The exposed portions of electrical connector 118 and electrical interconnection 120 are enclosed or encapsulated by dispensing polymer 124, a liquid encapsulation material. Preferably polymer 124 is a thermally cured or ultraviolet light (UV) cured epoxy. However, other materials such as polyimides or benzocyclobutenes can also be utilized. Inorganic layer 128 is formed over polymer encapsulant 124, as shown in FIG. 1. Inorganic layer 128 can be essentially any thin inorganic layer such as thin metal or ceramic films. Preferably inorganic layer 128 is a metal such as tantalum or palladium having a thickness in the range from about 0.05 microns to about 0.5 microns.

More preferably inorganic layer 128 includes a thin layer of chromium in the range from about 0.01 to about 0.02 microns thick and a tantalum layer in the range from about 0.05 microns to about 0.1 microns thick deposited over the chromium layer. However, a wide range of metals such as palladium, gold, tungsten, tantalum, chromium, aluminum, nickel, copper and alloys of such metals to name just a few can all be utilized. In addition, a wide range of ceramic like materials such as oxides, nitrides, carbides, borides, fluorides, and mixtures thereof can also be utilized. Although FIG. 1 shows polymer 124 and inorganic layer 128 enclosing electrical connector 118 and electrical interconnection 120 in some applications it can be beneficial to enclose or encapsulate all of substrate 110 with polymer 124 and inorganic layer 128. In addition, FIG. 1 shows inorganic layer 128 disposed over polymer 124, however inorganic layer 128 can also be deposited over electrical connector 118 and electrical interconnection 120. In such an application inorganic layer 128 is a non-conductive material.

The adhesion between polymer 124 and inorganic layer 128 can be adjusted by pretreating the surface of polymer 124 before the formation or deposition of inorganic layer 128. Preferably, either plasma treatment or corona discharge treatment of polymer 124 with a reactive gas such as oxygen is used. However, other surface treatments such as laser, flame, chemical, or combinations thereof can also be utilized. In addition, a coupling agent can also be utilized by either incorporation in polymer 124 or by application to the surface of polymer 124 after dispensing.

Figure 2A:
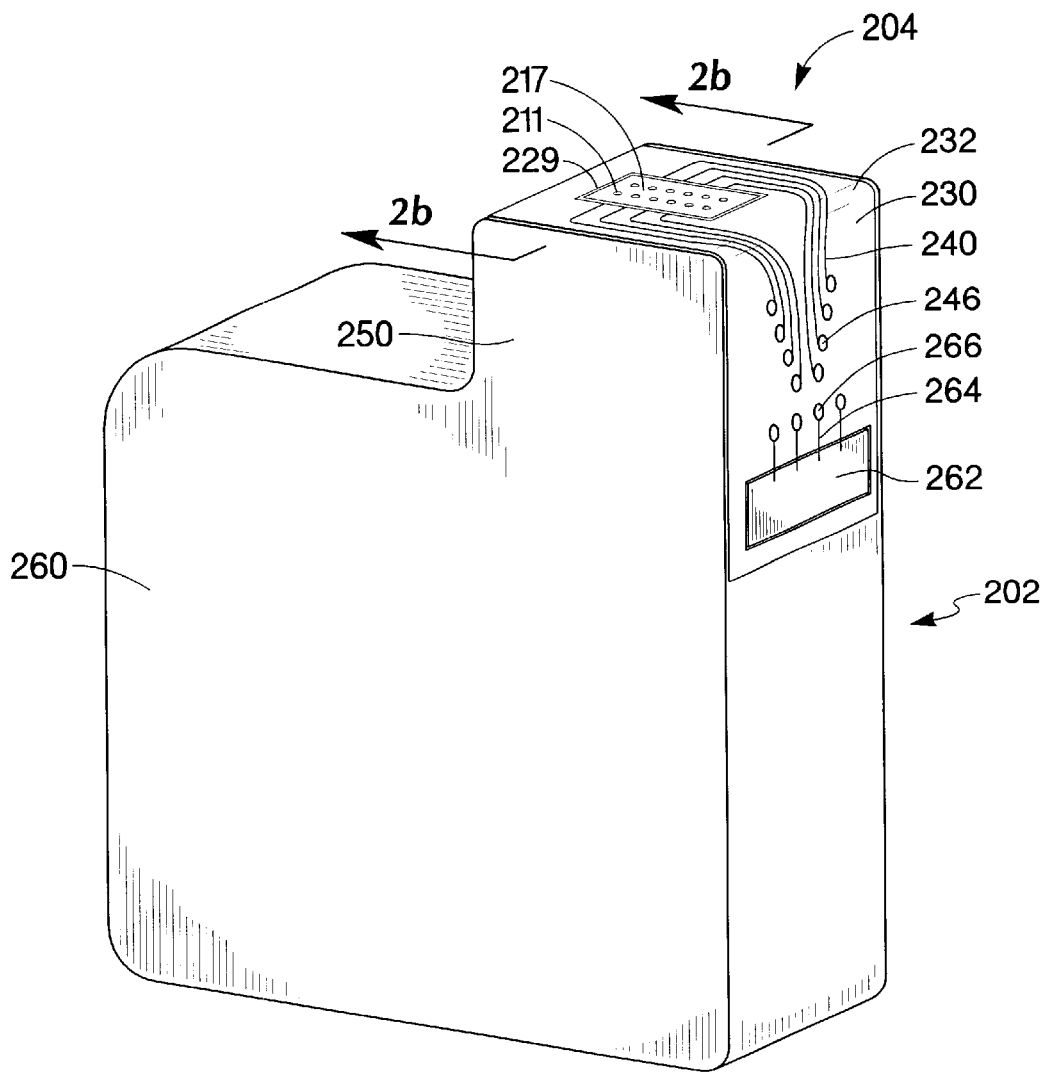
FIG. 2a is a perspective view of an electronic device according to an embodiment of the present invention.

Referring to FIG. 2a, an exemplary embodiment of a fluid ejection cartridge 202 of the present invention is shown in a perspective view. In this embodiment, fluid ejection cartridge 202 includes reservoir 260 that contains a fluid, which is supplied to a substrate (not shown) that is secured to the back of nozzle layer 217. Nozzle layer 217 contains one or more nozzles 211 through which fluid is ejected. Ejector head 204 includes the substrate (not shown), nozzle layer 217, and nozzles 211.

Flexible circuit 232 of the exemplary embodiment is a polymer film and includes electrical traces 240 connected to electrical contacts 246. Electrical traces 240 are routed from electrical contacts 246 to electrical connectors or bond pads on the substrate (not shown) to provide electrical connection for the fluid ejection cartridge 202. Encapsulation beads 229 are dispensed along the edge of nozzle layer 217 and the edge of the substrate enclosing the end portion of electrical traces 240 and the bond pads on the substrate.

Information storage element 262 is disposed on cartridge 202 as shown in FIG. 2a. Preferably, information storage element 262 is electrically coupled to flexible circuit 232. Information storage element 262 is any type of memory device suitable for storing and outputting information that may be related to properties or parameters of the fluid or ejector head 204. Preferably, information storage element 262 is a memory chip mounted on flexible circuit 232 and electrically coupled through electrical traces 264 to electrical contacts 266. Alternatively, information storage element 262 can be encapsulated in its own package with corresponding separate electrical traces and contacts. When fluid ejection cartridge 202 is either inserted into, or utilized in, a dispensing system information storage element 262 is electrically coupled to a controller that communicates with information storage element 262 to use the information or parameters stored therein. However, other forms of information storage can also be utilized for the information storage element 262, such as a bar code or other device that allows storage of information.

Figure 2B:
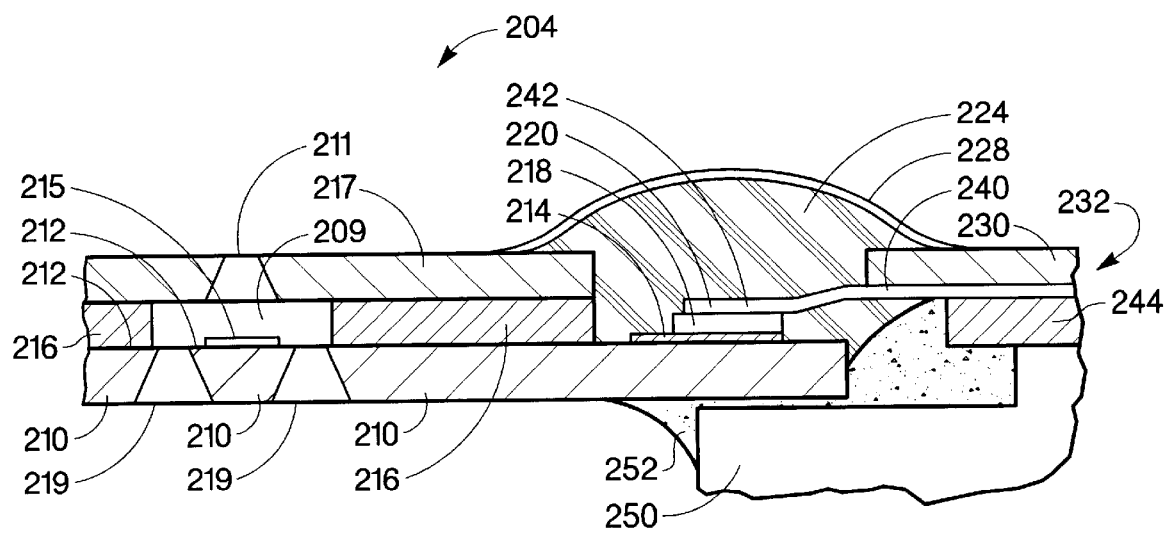
FIG. 2b is a cross-sectional view of an electronic device according to an embodiment of the present invention.

A cross-sectional view of ejector head assembly 204 is shown FIG. 2b showing inorganic layer 228 providing moisture and corrosion protection to electrical interconnection 220 and electrical connector or bond pad 218. Substrate 210 has fluid ejector 215 formed on active surface 212. Preferably fluid ejector 215 is a thermal resistor, however, other fluid ejectors may also be utilized such as piezoelectric, flex-tensional, acoustic, and electrostatic. In addition, substrate 210, preferably, includes one or more transistors or other logic devices (not shown) formed on substrate 210, however, "direct drive" structures can also be utilized. In a direct drive application each fluid ejector is electrically connected to a bond pad. Chamber layer 216 forms fluidic chamber 209 around fluid ejector 215 so that when fluid ejector 215 is activated fluid is ejected out of nozzle 211, which is generally located over fluid ejector 215. Fluid channels 219 formed in substrate 210 provide a fluidic path for fluid in reservoir 260 (See FIG. 2a) to fill fluidic chamber 209.

As shown in FIG. 2b, nozzle layer 217 is formed over chamber layer 216. Nozzle layer 217 may be formed of metal, polymer, glass, or other suitable material such as ceramic. In particular, a photodefinable polymer can be used to form both nozzle layer 217 and chamber layer 216. For example, a photodefinable polyimide, benzocyclobutene, or epoxy can be utilized. Forming nozzle layer 217 and chamber layer 216 from a photoimagible epoxy available from MicroChem Corp. under the trademark NANO SU-8 is particularly preferable. However, other materials such as polyesters, polyethylene naphthalates (PEN), epoxies, and polycarbonates can also be utilized. In addition, nozzle layer 217 can also be formed from a metal such as a nickel base enclosed by a thin gold, palladium, tantalum, or rhodium layer.

Dielectric layer 214 is formed over at least a portion of substrate 210, providing electrical isolation for one or more bond pads 218. Preferably, substrate 210 is a silicon integrated circuit including transistors and other logic devices (not shown), however, materials such as germanium, gallium arsenide, amorphous silicon, aluminum oxide, polysilicon, and other substrates that support active and passive devices can also be utilized. Dielectric layer 214 and bond pad 218 are preferably formed utilizing conventional semiconductor equipment. Dielectric layer 214, preferably, is a dual layer structure including silicon carbide and silicon nitride, with each layer having a thickness in the range from about 0.05 microns to 2.0 microns. However, other materials such as silicon oxide, siliconoxynitride, or aluminum oxide, and other thickness can also be utilized depending on the particular application of fluid ejection cartridge 202.

Preferably a dual layer structure is utilized for bond pad 218. A first metal layer comprising tantalum having a thickness in the range from about 0.075 microns to about 5.0 microns is deposited over dielectric layer 214. A second metal layer comprising gold having a thickness in the range from about 0.1 microns to about 2.5 microns is deposited over the first metal layer. However, other metals and metal alloys can also be utilized such as aluminum and aluminum alloys. In addition, other thicknesses can also be utilized.

Flexible circuit 232 includes base film 230 and electrical traces 240 as shown in FIG. 2b. Preferably, base film is formed from a polymer such as polyimide, polyester, or polyethylene naphthalate (PEN) to name a few. Examples of commercially available nozzle layer materials include a polyimide film available from E. I. DuPont de Nemours & Co. under the trademark "Kapton", a polyimide material available from Ube Industries, LTD (of Japan) under the trademark "Upilex." Flexible circuit 232 is formed utilizing techniques well known in the art such as conventional photolithographic etching, metal deposition, and electroplating processes. Preferably, flexible circuit 232 is processed in a tape form using reel-to-reel processing equipment.

Electrical interconnection 220, preferably, is formed utilizing a conventional TAB bonder, such as an inner lead bonder commercially available from Shinkawa Corporation. The bonder applies pressure to electrical trace end 242 pressing trace end 242 onto bond pad 218 through the opening formed by the end of nozzle layer 217 and the end of base film 230. The bonder applies heat, to form a thermocompression bond thereby forming electrical interconnection 220. Other types of bonding can also be utilized, such as ultrasonic bonding, conductive adhesive, solder paste, or other electrical bonding technologies.

To provide mechanical support as well as environmental protection a polymer bead 224, such as an epoxy, is dispensed so that the dispensed polymer 224 encloses electrical interconnection 220, bond pad 218, and electrical trace end 242. Preferably polymer 224 is a thermally cured or ultraviolet light (UV) cured epoxy dispensed in a liquid form through a needle dispenser. However, other materials such as polyimides, benzocyclobutenes, and polyacrylates can also be utilized.

Inorganic film 228 is formed over polymer bead 224, preferably, utilizing conventional thin film deposition equipment, such as thermal or electron beam evaporators, sputter deposition systems, or chemical vapor deposition systems. However, other thin film deposition technologies can also be utilized such as electroless deposition, electroplating, or screen printing are just a few examples. Inorganic film 228 can be essentially any thin inorganic layer such as a thin metal or ceramic film. Preferably inorganic film 228 is a metal such as tantalum, platinum, or gold having a thickness in the range from about 0.05 microns to about 1.0 micron. More preferably inorganic layer 128 includes a thin layer of chromium in the range from about 0.01 microns to 0.02 microns thick and a tantalum layer in the range from about 0.1 microns to about 0.75 microns thick deposited over the chromium layer. However, a wide range of metals such as palladium, gold, tungsten, aluminum, tantalum, chromium, nickel, titanium, copper, and alloys of such metals to name just a few can all be utilized. In addition, a wide range of ceramic like materials such as oxides, nitrides, carbides, borides, fluorides, and mixtures thereof can also be utilized. Silicon oxide and silicon nitride having a thickness in the range from about 0.1 microns to about 0.5 microns are two examples of ceramic like materials that are preferable.

The adhesion between polymer 224 and inorganic layer 228 can be adjusted by pretreating the surface of polymer 224 before the formation or deposition of inorganic layer 228. Preferably, either plasma treatment or corona discharge treatment of polymer 224 with a reactive gas such as oxygen is used. However, other surface treatments such as laser, flame, chemical, or combinations thereof can also be utilized. In addition, a coupling agent can also be utilized by either incorporation in polymer 224 or by application to the surface of polymer 224 after dispensing.

Adhesive 252 is dispensed around the periphery of substrate 210 providing both a method of attachment and a fluid seal between substrate 210 and fluid ejection body 250. Preferably adhesive 252 is a thermally cured epoxy, however, other adhesives such as hot melt, silicone, UV curable, and mixtures thereof can also be utilized. Further, a patterned adhesive film may be positioned on either fluid ejection body 250 or substrate 210, as opposed to dispensing a bead of adhesive.

Coverlayer 244 is heat staked to fluid ejection body 250 providing an adhesive function to attach flexible circuit 232 (shown in FIG. 2) to fluid ejection body 250 as well as providing environmental protection of electrical traces 240. Preferably coverlayer 244 is a three-layer laminate with a 1.5 mil ethyl vinyl acetate (EVA), a 0.5 mil polyethylene terephthalate (PET) layer, and a 1.5 mil ethyl vinyl acetate layer. EVA is a thermoplastic material, which reflows upon heating and bonds to fluid ejection body 250. The PET film acts as a carrier layer that allows mechanical punching and handling of coverlayer 244 without excessive stretching. In some applications a single layer can also be utilized such as a single layer of EVA, polyolefin, or acrylic acid copolymers to name a few.

Figure 3:
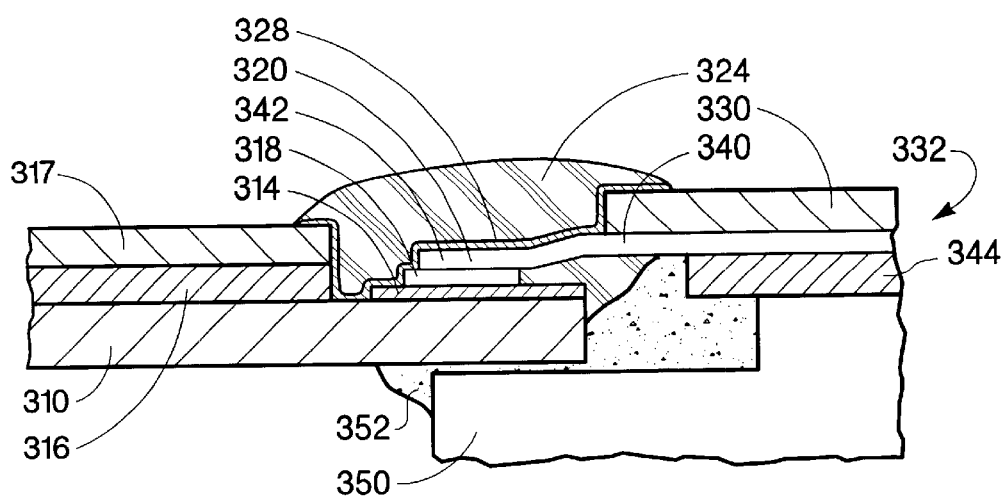
FIG. 3 is a cross-sectional view of an electronic device according to an embodiment of the present invention.

Referring to FIG. 3 an alternate embodiment of the present invention is shown, in a cross-sectional view where polymer 324 is formed over inorganic layer 328, which is formed over bond pad 318, and electrical interconnection 320. In this embodiment, inorganic layer 328 is formed from a non-conductive material or hermetic material such as oxides, nitrides, carbides, borides, fluorides, and mixtures thereof. Preferably, inorganic layer 328 is deposited, as a thin film having a thickness in the range from about 0.1 microns to about 0.5 microns, utilizing conventional thin film deposition equipment, such, sputter deposition systems, chemical vapor deposition systems, or plasma enhanced chemical vapor deposition systems. As shown in FIG. 3a inorganic layer 328 is deposited essentially within the opening formed by the end of nozzle layer 317 and the end of base film 330 and preferably extending a short distance, on the order of a few microns, over the end portion of both nozzle layer 317 and base film 330. The particular length that inorganic layer 328 extends over nozzle layer 317 and base film 330 depends on for example the particular material used, the method of deposition, and fluid ejected. In addition, the thickness of inorganic layer 328 also depends on the particular materials used, the method of deposition and the uniformity in step coverage obtained under the deposition conditions.

Figure 4A:
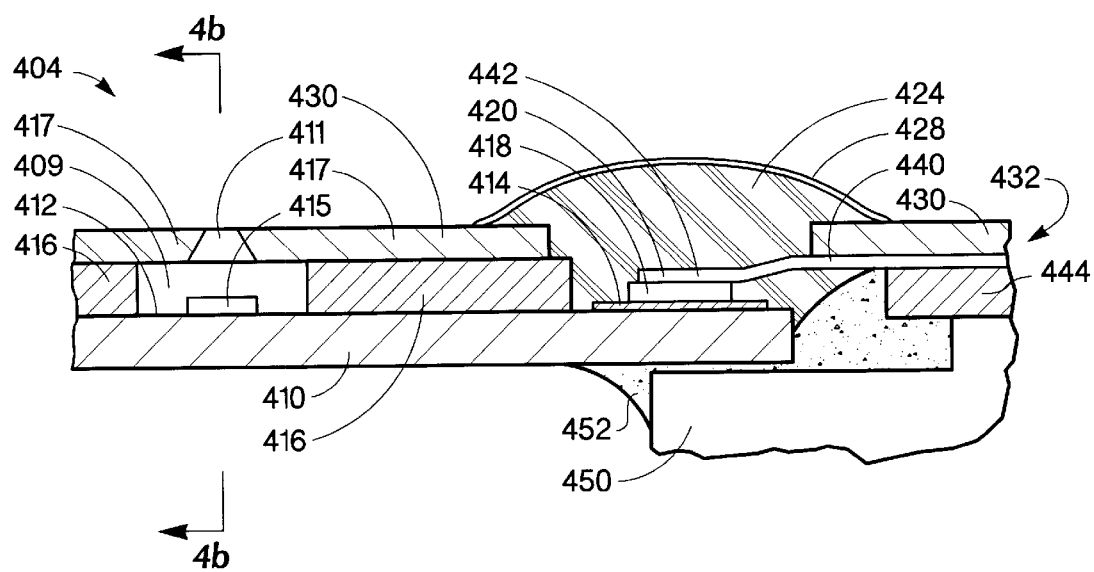
FIG. 4a is a cross-sectional view of an electronic device according to an embodiment of the present invention.

Referring to FIG. 4 an alternate embodiment of the present invention is shown, in a cross-sectional view where nozzle layer 417 and base film 430 form an integrated nozzle layer and flexible circuit. In this embodiment, ejector head 404 includes substrate 410, nozzle 411, and base film 430 that includes nozzle layer 417. Nozzle layer 417 contains one or more nozzles 411 through which fluid is ejected. The nozzle layer 417 may be formed from a polymer, preferably, a polymer such as polyimide, polyester, polyethylene naphthalate (PEN), epoxy, or polycarbonate. Examples of commercially available nozzle layer materials include a polyimide film available from E. I. DuPont de Nemours & Co. under the trademark "Kapton", or a polyimide material available from Ube Industries, LTD (of Japan) under the trademark "Upilex." Nozzles 411 are formed by any of the techniques well known in the art, such as laser ablation, plasma etching, or chemical etching. In this embodiment all of the structures, such as fluid channel layer 416, coverlayer 444, and bond pad 418 have substantially the same function as illustrated and described in FIG. 2b.

Flexible circuit 432 includes base film 430 and electrical traces 440. Dielectric layer 414 is formed over at least a portion of substrate 410, providing electrical isolation for one or more bond pads 418. Bond pad 418, as described above, preferably, is formed as a dual layer structure. To provide mechanical support as well as environmental protection polymer bead 424, such as an epoxy, is dispensed so that dispensed polymer 424 encloses electrical interconnection 420, bond pad 418, and electrical trace end 442. Inorganic film 428 is formed over polymer bead 424 as described above. The materials, processes and equipment utilized can be substantially the same as that described for the embodiment shown in FIGS. 2a and 2b. In addition, inorganic film 428 may also be formed over bond pad 418, and electrical interconnection 420 as illustrated in FIG. 3.

Figure 4B:
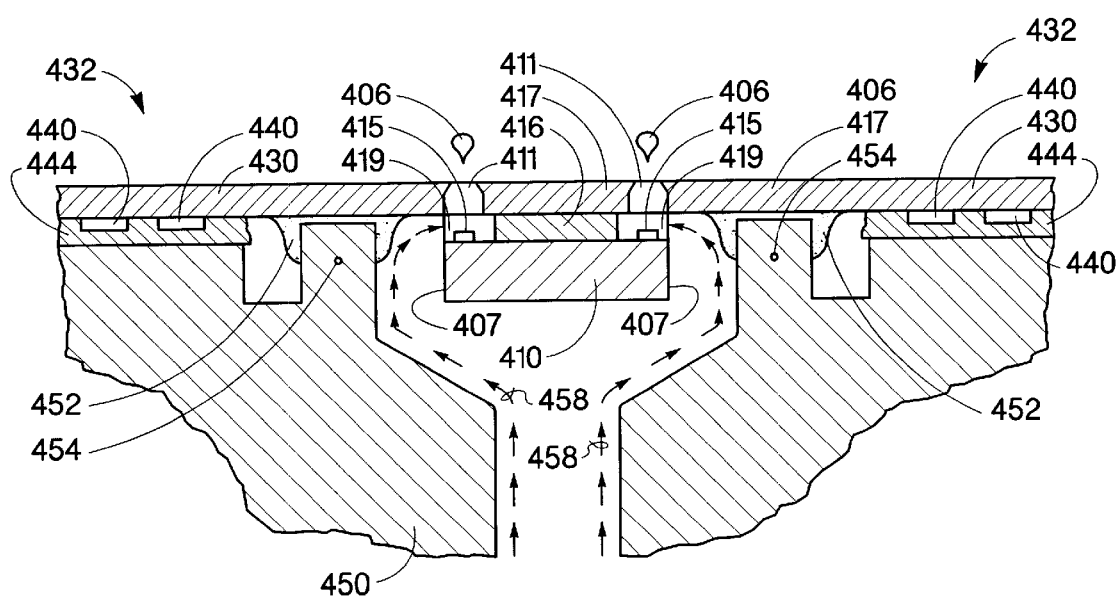
FIG. 4b is a cross-sectional view of an electronic device according to an embodiment of the present invention.

In this embodiment, fluid 458 flows around edges 407 of substrate 410 and directly into fluid channels 419 as shown in a cross-sectional view in FIG. 4b. When fluid ejectors 415 are activated, fluid over the fluid ejectors 415 is ejected out of nozzles 411 as illustrated by drops 406. Adhesive 452 is shown applied to inner raised wall 454 of fluid ejection body 450 forming a portion of the fluid seal. Fluid channel layer 416, preferably is bonded to nozzle layer 417 through a heat staking process, however, a thin adhesive layer between nozzle layer 417 and fluid channel layer 416 may also be used. In addition, a portion of flexible circuit 430 is preferably heat staked via coverlayer 444 to plastic fluid ejection body 450 is also shown in FIG. 4b. Coverlayer 444 also encloses electrical traces 440 of flexible circuit 432.

Figure 5:
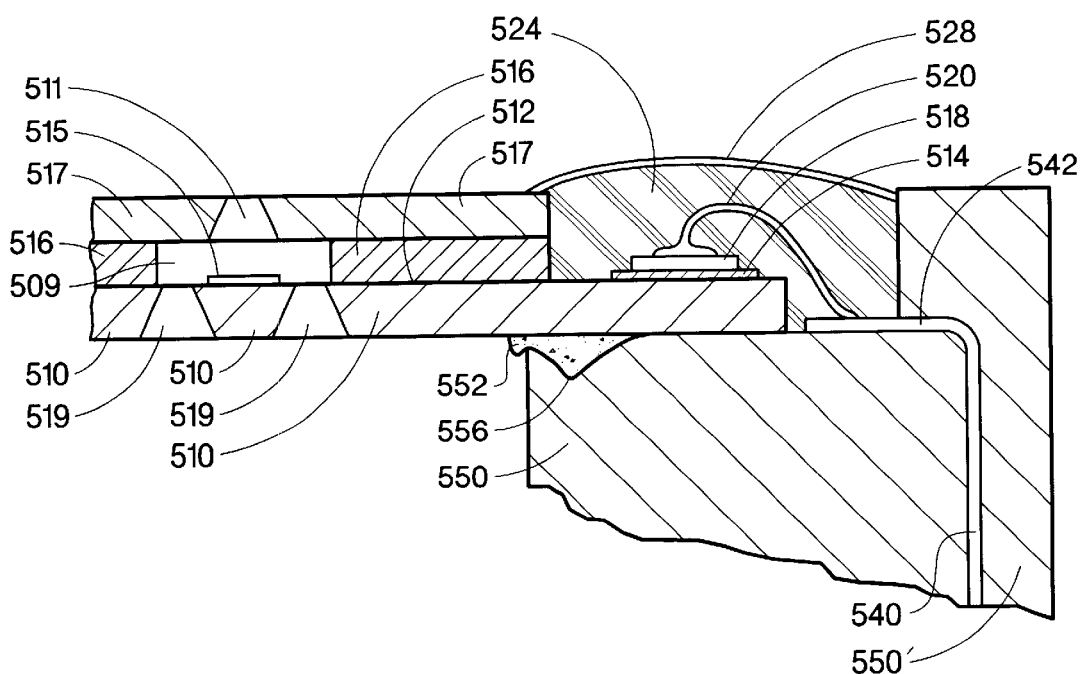
FIG. 5 is a cross-sectional view of an electronic device according to an embodiment of the present invention.

Referring to FIG. 5 an alternate embodiment of the present invention is shown in a cross-sectional view where electrical interconnection 520 is formed utilizing a wire bond. In this embodiment, electrical traces 540 are either formed in fluid ejection body 550 and 550' or outer portion 550' is adhesively or mechanically attached to fluid ejection body 550 to provide mechanical and environmental protection of electrical traces 540. Preferably, electrical traces 540 are formed utilizing molded interconnect technology, however other electrical trace routing schemes such as FR4 board, lead frames, flexible circuits, and combinations of routing schemes can also be utilized. Ultrasonic ball-wedge bonding is preferred, however, other bonding technologies can also be utilized such as thermocompression or thermosonic bonding coupled with wedge-wedge or ball-wedge techniques. In this embodiment, structures, such as fluid channel layer 516, substrate 510, and bond pad 518 have substantially the same function as illustrated and described above.

In this embodiment, fluid channels 519 formed in substrate 510 provide a fluidic path to fill fluidic chamber 509. When fluid ejectors 515 are activated, fluid over the fluid ejectors 515 is ejected out of nozzles 511. Adhesive 552 is shown applied to adhesive channel 556 of fluid ejection body 550 forming a fluid seal with substrate 510. To provide mechanical support as well as environmental protection polymer bead 524, such as an epoxy, is dispensed so that dispensed polymer 524 essentially encloses electrical interconnection 520, bond pad 518, and electrical trace end 542. Inorganic film 528 is formed over polymer bead 524 as described above. In addition, inorganic film 528 may also be formed over electrical conductor 518 and electrical interconnection 520 as described for the embodiments shown in FIGS. 1 and 3. The materials, processes and equipment may be substantially the same as that described above.

Figure 6:
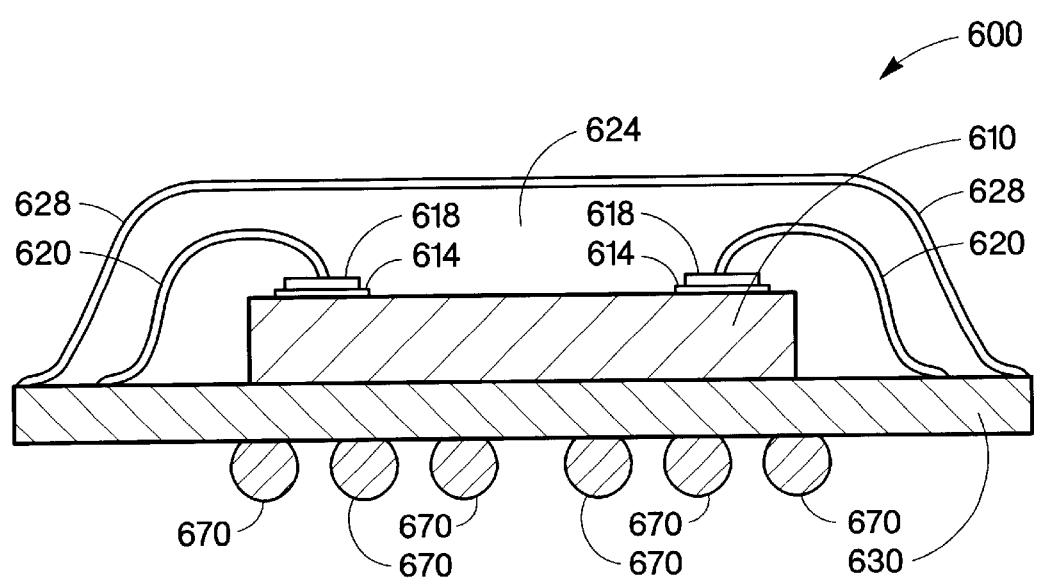
FIG. 6 is a cross-sectional view of an electronic device according to an embodiment of the present invention.

Referring to FIG. 6 an alternate embodiment of the present invention is shown in a simplified cross-sectional view where electronic device 600 includes base film 630 that provides rerouting of electrical interconnection 620 to solder balls 670 forming what is commonly referred to as a ball grid array (BGA). The details of the rerouting structures as well as the electrical connection of electrical interconnection 620 to those structures has been omitted to simplify the drawing. Dielectric layer 614 and bond pads 618 are formed in a manner similar to that described above. In this embodiment electrical interconnection 620, preferably is a wire bond, however other bonding schemes such as conductive adhesives, and anisotropic conductive adhesives can also be utilized. Preferably, base film 630 is a flexible circuit, however, other substrates utilized for electrical trace routing can also be utilized such as FR4 board or a ceramic die carrier. In addition base film 630 may also be a multi-layered structure providing for an increased number of interconnects while keeping the footprint of the package small. Polymer 624 is a molded encapsulant, preferably an epoxy; however, other polymers may also be utilized such as polycarbonates, polyimides, and benzocyclobutenes to name a few. Preferably, molded polymer 624 is formed utilizing conventional tooling used for molded parts well known in the art of electronic packaging. Inorganic film 628 is formed over molded polymer encapsulant 624 as described above. The materials, processes and equipment may be substantially the same as that described above.

What is claimed is:

1. An electronic device comprising:
   a substrate;
   a substrate electrical connector disposed on said substrate;
   a carrier lead electrically coupled to said substrate electrical connector;
   a polymer enclosing said substrate electrical connector; and
   an inorganic film disposed over said substrate electrical connector and said inorganic film contacts said polymer.

2. The electronic device of claim 1, further comprising at least one active device disposed on said substrate.

3. The electronic device of claim 2, further comprising an electrical trace coupling said at least one active device and said substrate electrical connector.

4. The electronic device of claim 1, wherein said substrate includes at least one fluid ejector.

5. The electronic device of claim 4, further comprising an electrical trace coupling said at least one fluid ejector and said substrate electrical connector.

6. The electronic device of claim 4, wherein said at least one fluid ejector further comprises at least one thermal resistor.

7. The electronic device of claim 1, wherein said carrier electrical trace is TAB bonded to said substrate electrical connector.

8. The electronic device of claim 1, further comprising a carrier bond pad electrically coupled to said substrate electrical connector.

9. The electronic device of claim 8, wherein said carrier bond pad is wire bonded to said substrate electrical connector.

10. The electronic device of claim 8, wherein said carrier bond pad is bonded to said substrate electrical connector using solder.

11. The electronic device of claim 8, wherein said carrier bond pad is adhesively bonded to said substrate electrical connector using a conductive adhesive.

12. The electronic device of claim 11, wherein said conductive adhesive is an anisotropically conductive adhesive.

13. The electronic device of claim 1, wherein said inorganic film is selected from the group consisting of a metal, an oxide, a nitride, a carbide, and mixtures thereof.

14. The electronic device of claim 1, wherein said inorganic film includes at least one of a metal, an oxide, a nitride, and a carbide.

15. The electronic device of claim 1, wherein said polymer includes a treated surface utilizing a surface treatment.

16. The electronic device of claim 15, wherein said surface treatment is selected from the group consisting of a plasma treatment, a corona discharge, a flame treatment, a laser treatment, a chemical treatment, or combinations thereof.

17. The electronic device of claim 1, wherein said inorganic film is in the range of about 0.05 microns to about 1.0 micron thick.

18. An electronic device comprising:
   a substrate;
   a substrate electrical connector disposed on said substrate;
   a carrier lead electrically coupled to said substrate electrical connector;
   a polymer enclosing said substrate electrical connector;
   an inorganic film disposed over said substrate electrical connector and said inorganic film contacts said polymer, wherein said inorganic film is in the range of about 0.05 microns to about 1.0 microns thick;
   at least one active device disposed on said substrate; and
   an electrical trace coupling said at least one active device and said substrate electrical connector.

19. A fluid ejection head comprising:
   a substrate including:
     at least one fluid ejector disposed thereon; and
     a dielectric layer disposed over at least a portion of said substrate;
   a substrate electrical connector in contact with said dielectric layer;
   a substrate carrier including a carrier electrical trace electrically coupled to said substrate electrical connector;
   a polymer enclosing said substrate electrical connector; and an inorganic film disposed over said substrate electrical connector in contact with said polymer.

20. The fluid ejection head of claim 19, further comprising:
at least one transistor disposed on said substrate; and
an electrical trace electrically coupling said at least one transistor to said at least one fluid ejector.

21. The fluid ejection head of claim 19, wherein said carrier electrical trace is TAB bonded to said substrate electrical connector.

22. The fluid ejection head of claim 19 above, wherein said substrate carrier is selected from the group consisting of a polyimide film, a polyester film, a polyester napthalate film, or combinations thereof.

23. The fluid ejection head of claim 19 above, wherein said substrate carrier is selected from the group consisting of a polyimide, a polyester, a polyester napthalate, or mixtures thereof.

24. The fluid ejection head of claim 19 above, further comprising a carrier bond pad electrically coupled to said substrate electrical connector.

25. The fluid ejection head of claim 24 above, wherein said carrier bond pad is wire bonded to said substrate electrical connector.

26. The fluid ejection head of claim 24 above, wherein said carrier bond pad is adhesively bonded to said substrate electrical connector using a conductive adhesive.

27. The fluid ejection head of claim 26, wherein said conductive adhesive is an anisotropic conductive adhesive.

28. The fluid ejection head of claim 19, wherein said polymer is selected from the group consisting of an epoxy, an acrylic, a polyimide and mixtures thereof.

29. The fluid ejection head of claim 19, wherein said inorganic film is selected from the group consisting of a metal, a oxide, a nitride, a carbide or combinations thereof.

30. The fluid ejection head of claim 19, wherein said inorganic film is selected from the group consisting of a metal, a oxide, a nitride, a carbide or mixtures thereof.

31. The electronic device of claim 19, wherein said polymer includes a treated surface utilizing a surface treatment.

32. The electronic device of claim 31, wherein said surface treatment is selected from the group consisting of a plasma treatment, a corona discharge, a flame treatment, a laser treatment, a chemical treatment, or combinations thereof.

33. The fluid ejection head of claim 19, wherein said inorganic film is in the range of about 0.05 microns to about 1.0 micron thick.

34. A fluid ejection cartridge comprising:
at least one fluid ejection head of claim 19; and
at least one reservoir fluidically coupled to said at least one fluid ejection head.

35. A fluid ejection head comprising:
a substrate including:
at least one fluid ejector disposed thereon; and
a dielectric layer disposed over at least a portion of said substrate;
a substrate electrical connector in contact with said dielectric layer;
a substrate carrier including a carrier electrical trace electrically coupled to said substrate electrical connector;
a polymer enclosing said substrate electrical connector;
an inorganic film disposed over said substrate electrical connector in contact with said polymer, wherein said inorganic film is in the range of about 0.05 microns to about 1.0 micron thick;
at least one transistor disposed on said substrate; and
an electrical trace electrically coupling said at least one transistor to said at least one fluid ejector.

36. A method of manufacturing a fluid ejection head comprising the steps of:
fabricating at least one fluid ejector on a substrate;
forming a substrate electrical connector on said substrate;
positioning a substrate carrier including a carrier electrical trace in proximity to said substrate;
electrically coupling said electrical trace to said substrate electrical connector;
encapsulating said substrate bond bad; and
depositing an inorganic film over said substrate electrical connector.

37. The method of claim 36, further comprising the steps of:
forming at least one transistor on said substrate; and
electrically coupling said at least one fluid ejector to said at least one transistor.

38. The method of claim 36, wherein said depositing step further comprises the step of protecting said substrate electrical connector from moisture.

39. The method of claim 36, wherein said depositing step further comprises the step of protecting said substrate electrical connector from corrosion.

40. The method of claim 36, wherein said step of electrically coupling said carrier electrical trace to said substrate electrical connector further comprises the step of TAB bonding an electrical beam of said carrier electrical trace to said substrate electrical connector.

41. The method of claim 36, wherein said step of electrically coupling said carrier electrical trace to said substrate electrical connector further comprises the step of utilizing a conductive adhesive to electrically couple said carrier electrical trace to said substrate electrical connector.

42. The method of claim 36, wherein said step of electrically coupling said carrier electrical trace to said substrate electrical connector further comprises the step of utilizing an anisotropic conductive adhesive to electrically couple said carrier electrical trace to said substrate electrical connector.

43. A method of manufacturing a fluid ejection head comprising the steps of:
fabricating at least one fluid ejector on a substrate;
forming a substrate electrical connector on said substrate;
positioning a substrate carrier including a carrier electrical trace in proximity to said substrate;
electrically coupling said electrical trace to said substrate electrical connector;
encapsulating said substrate bond bad;
depositing an inorganic film over said substrate electrical connector, wherein said inorganic film is in the range of about 0.05 microns to about 1.0 micron thick;
forming at least one transistor on said substrate; and
electrically coupling said at least one fluid ejector to said at least one transistor.

44. An electronic device comprising:
a substrate;
a carrier;
means for electrically coupling said carrier to said substrate;
means for enclosing said electrical connection to said substrate; and an inorganic film disposed over said means for electrically coupling, wherein said inorganic film is in contact with said means for enclosing said electrical connection to said substrate.

45. The electronic device of claim 44, further comprising a means for modifying a signal.

46. The electronic device of claim 44, further comprising a means for ejecting a fluid.

47. A method of manufacturing an electronic device comprising the steps of:

forming a substrate electrical connector on a substrate;

electrically coupling a carrier lead to said substrate electrical connector;

encapsulating said substrate electrical connector using an encapsulant; and depositing an inorganic film over said substrate electrical connector in contact with said encapsulant.

* * * * *